(12) United States Patent
Nagano et al.

(10) Patent No.: US 6,815,698 B2
(45) Date of Patent: Nov. 9, 2004

(54) CHARGED PARTICLE BEAM EXPOSURE SYSTEM

(75) Inventors: Osamu Nagano, Yokohama (JP); Yuichiro Yamazaki, Tokyo-To (JP); Susumu Hashimoto, Kawasaki (JP); Motosuke Miyoshi, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 09/920,633

(22) Filed: Aug. 3, 2001

(65) Prior Publication Data

US 2002/0033458 A1 Mar. 21, 2002

(30) Foreign Application Priority Data

Aug. 4, 2000 (JP) .......................................... 2000-237163

(51) Int. Cl.$^7$ ................................................. G21K 5/10
(52) U.S. Cl. .............................. 250/492.22; 250/492.1; 250/492.21
(58) Field of Search ......................... 250/492.22, 492.1, 250/491.21, 396 R, 398

(56) References Cited

U.S. PATENT DOCUMENTS 4,075,488 A 2/1978 Okayama et al. ........ 250/396 R (List continued on next page.)

FOREIGN PATENT DOCUMENTS

| JP | 2000-173529 | 6/2000 |
| JP | 2001-93825 | 4/2001 |

OTHER PUBLICATIONS

H. Sunaoshi et al.; "Electron Beam Calibration Method for Character Projection Exposure System EX–8D"; Jpn. J. Appl. Phys. vol. 34, pp. 6679–6683, Part 1, No. 12 B, 1995.

(List continued on next page.)

*Primary Examiner*—Hai Pham
*Assistant Examiner*—Lam Nguyen
(74) *Attorney, Agent, or Firm*—Finnegan, Henderson, Farabow, Garrett & Dunner, L.L.P.

(57) ABSTRACT

A charged particle beam exposure system comprising: a charged particle beam emitting device which generates charged particle beams with which a substrate is irradiated, the charged particle beam emitting device generating the charged particle beams at an accelerating voltage which is lower than that at which an influence of a proximity effect occurs; an illumination optical system which adjusts a beam diameter of the charged particle beams so that density of the charged particle beams is uniform; an character aperture in which an aperture hole is formed in a shape corresponding to a desired pattern to be written; a first deflector which deflects the charged particle beams by an electrostatic field that the charged particle beams have a desired sectional shape and travel towards a desired aperture hole and which returns the charged particle beams passing through the aperture hole to an optical axis thereof; a reducing projecting optical system which forms a multi-pole lens field so that the charged particle beams passing through the character aperture substantially reduce at the same demagnification both in X and Y directions when the optical axis extends in Z directions and form an image on the substrate without forming any crossover between the character aperture and the substrate; and a second deflector which deflects the charged particle beams passing through the character aperture by means of an electrostatic field to scan the substrate with the charged particle beams.

25 Claims, 12 Drawing Sheets

U.S. PATENT DOCUMENTS 4,945,246 A * 7/1990 Davis et al. ............. 250/492.2
5,298,757 A    3/1994 Okayama ................ 250/396 R
6,525,328 B1 * 2/2003 Miyoshi et al. ........ 250/492.22

OTHER PUBLICATIONS

Miyoshi, M. et al.; "Electron Beam Lithography System and Pattern Writing Method"; U.S. Ser. No.: 09/624,355, Filed Jul. 24, 2000, Specification 32 pages., and 10 sheets of drawings.

Thomson, M.G.R., *The electrostatic moving objective lens and optimized deflection systems for microcolumns*, 14 J. Vacuum Sci. & Tech. B 3802 (Nov/Dec 1996).

D.A. Crewe, et al., *Initial images with a partially micromachined scanning electron microscope*, 14 J. Vacuum Sci. & Tech. B 3808 (Nov/Dec 1996).

* cited by examiner

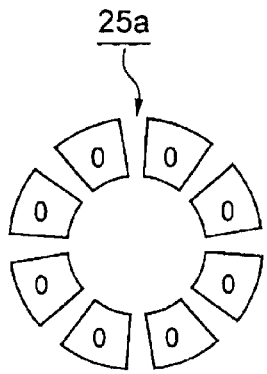
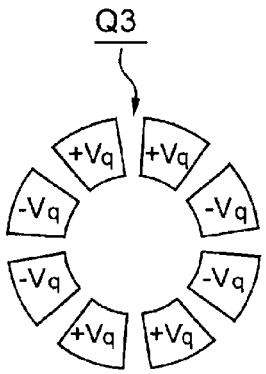
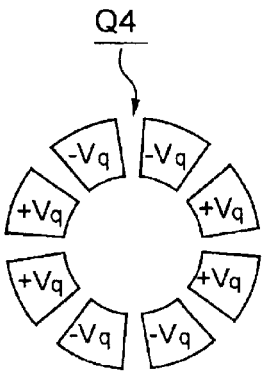
FIG. 5A     FIG. 5B     FIG. 5C
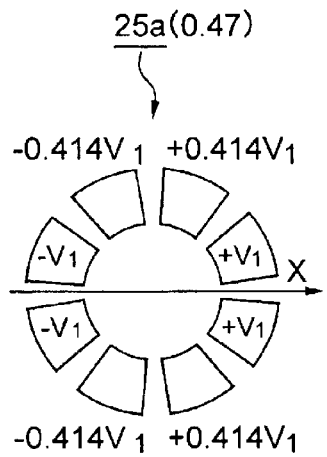
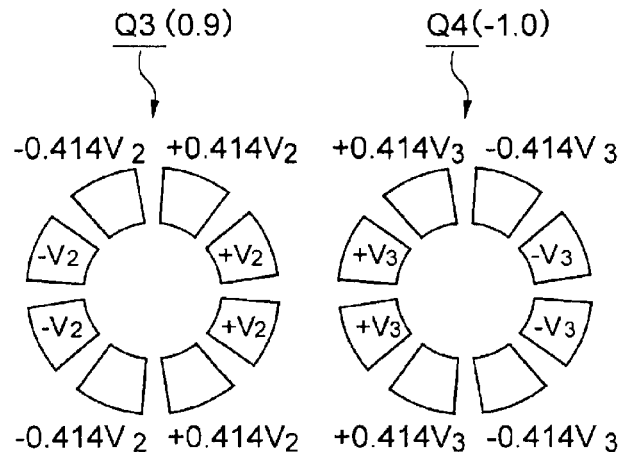
FIG. 6A     FIG. 6B     FIG. 6C
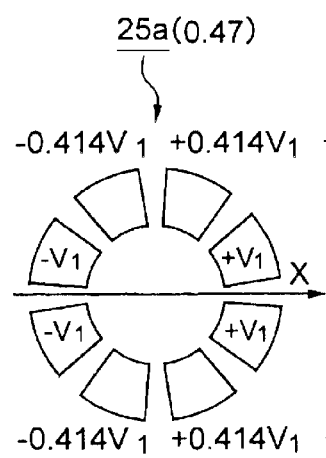
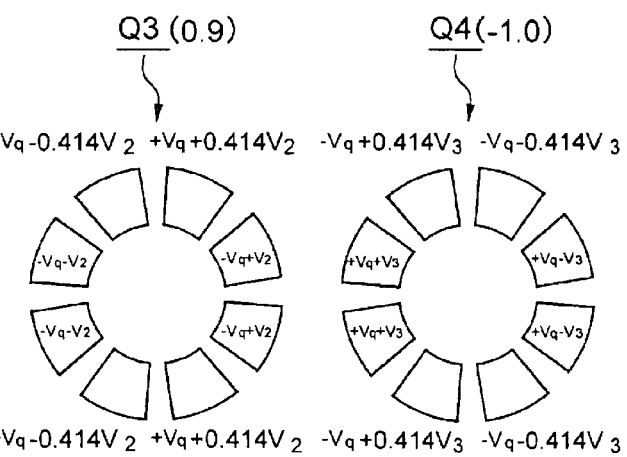
FIG. 7A     FIG. 7B     FIG. 7C

CHARGED PARTICLE BEAM EXPOSURE SYSTEM

CROSS REFERENCE TO RELATED APPLICATION

This application claims benefit of priority under 35USC §119 to Japanese patent application No.2000-237163, filed on Aug. 04, 2000, the contents of which are incorporated by reference herein.

BACKGROUND OF THE INVENTION

1. Field of the Invention

The present invention relates generally to a charged particle beam exposure system, such as an ion or electron beam exposure system which is used in a process for fabricating semiconductors such as LSIs or VLSIs. More specifically, the invention relates to a low-accelerating-voltage charged particle beam exposure system.

2. Description of the Prior Art

Charged particle beam exposure systems have the function of being capable of forming a high resolution pattern since it is possible to write at a resolving power of a wavelength level of electrons (or ions) which is shorter than light wavelength. On the other hand, since a complete pattern is directly written with small divided pattern beams unlike a mask writing system based on light exposure, there is a problem in that charged particle beam exposure systems take a lot of time to write. However, in view of characteristics that accurate fine line patterns can be formed, the charged particle beam exposure technique has been developed as the next technique to the lithography technique of the light exposure system, or as an important tool to the fabrication of semiconductors in a multi-product small-lot production such as ASIC.

A method for direct-writing a pattern with electron beams mainly uses two systems. That is, there is a system for writing a pattern by scanning the whole surface of a wafer while on-off-controlling small round beams, and a VSB writing system for writing a pattern with electron beams passing through a stencil aperture. As the electron beam writing technique developed from the VSB writing, there has been developed a bulk writing system for preparing a stencil on which repeated patterns are formed as one block and for selecting one of the patterns of the stencil to enable a high-speed writing.

First, as a conventional charged particle beam exposure system, a typical example of an electron beam lithography system of a VSB writing system is shown in FIG. 10 (H. Sunaoshi et al.; Jpn. J. Appl. Phys. Vol. 34 (1995), pp. 6679-6683, Part 1, No. 128, December 1995). Furthermore, in the following drawings, the same reference numbers are given to the same portions to suitably omit the descriptions thereof.

Electron beams 7 emitted and accelerated from an electron gun 11 are arranged as uniform electron beams by means of an illumination lens 15 and pass through a first forming aperture 85 to be formed as rectangular electron beams, and thereafter, projected on a second shaping aperture 89 of a rhombic or rectangular shape by means of a projection lens 87. At this time, the beam irradiation position on the second shaping aperture 89 is controlled by a shaping deflector 21 so that the shape and the area of the second shaping aperture 89 is irradiated with the pattern beams in accordance with CAD data. The beams passing through the second shaping aperture 89 are reduced and projected by means of a reducing lens 64 and an objective lens 66, and a position of the beams on a region of a wafer 14 to be written is controlled by means of a main deflector 95 and a sub deflector 93. In this case, the main deflector 95 controls the interior of a stripe of an irradiation region to be written (main field) with respect to the wafer 14 referring to the position of an XY stage (not shown), and the sub deflector 93 controls the position of a range to be written which is obtained by finely dividing the interior of the stripe (subfield). Below the objective lens 66, there is an electron detector 33 for detecting secondary electrons and back-scattered electrons (which will be hereinafter referred to as secondary electrons and so forth) which are produced when the wafer 14 is irradiated with the electron beams 7. By processing the detected signals acquired by the electron detector 33, various control parts (not shown) detect an image of SEM, and controls such as adjustment of the trajectories of the beams based thereon are carried out.

Since the electron optical system of an electron beam lithography system 120 shown in FIG. 10 comprises electromagnetic lenses and electrostatic deflectors, it is required to design the electron optical system while sufficiently taking account of the influence of the total optical characteristics of the lenses, the deflectors, the precision of mechanical assembly and contamination. In addition, in order to improve the resolution of beams, there has been widely adopted a system for driving highly accelerated electron beams 7 into a resist on the wafer 14. For that reason, there is caused the proximity effect which is a phenomenon that the incident electron beams 7 reflect on various multilayer thin films deposited on the bottom face of the resist of the wafer 14 to travel above the resist again. This proximity effects causes blurring and deterioration of resolution on the written pattern. Therefore, in the design of the electron beam lithography system, it is essential that the control for correcting the proximity effect be carried out, so that it is required to provide a large-scale system in a control part in addition to the electron optical system. Thus, there is a problem in that the system is complicated and troubles are induced, so that precision is lowered. Moreover, since highly accelerated electrons are used, there is the possibility that the surface of the wafer may be damaged.

In order to eliminate the above described problems in the VSB system of high-accelerating-voltage charged particle beams, an electron beam lithography system of an aperture system using low-accelerating-voltage electron beams has been proposed (Japanese Patent Application No. 10-363071, J. Vac. Sci. Technol. B14 (6), 1996, 3802). The electron beam lithography system proposed in Japanese Patent Application No. 10-363071 is shown in FIG. 11. A first aperture 13 having a rectangular or circular opening is irradiated with electron beams 67 which are emitted and accelerated from an electron gun 11. The electron beams 67 passing through the first aperture 13 travel toward a second shaping aperture 19 comprising the arrangement of a plurality of bulk exposure cell apertures. The beam diameter of the electron beams 67 is adjusted by means of illumination lenses 15a and 15b to such a size which is sufficiently larger than that of any one of cell apertures and in which the electron beams 67 do not interfere with adjacent cell patterns. The illumination lenses 15a and 15b comprise two electrostatic lenses (Einzel lenses), and a negative voltage is applied to the central electrode to use the illumination lenses 15a and 15b. The beams passing through the second illumination lens 15b are controlled to be deflected toward a target position by means of a first shaping deflector 17 so that a target cell aperture of the plurality of cell apertures formed in the second shaping aperture can be selected. The electron beams 67 passing through the second shaping aperture 19 start as cell pattern beams leaving the second shaping aperture 19, and pass through a reducing lens 64 in a state that the beams are returned to an optical axis by a second shaping deflector 21.

Above the reducing lens 64, a third shaping aperture 62 is provided for cutting undesired beams scattered by the second shaping aperture 19 and so forth. The electron beams reduced by the reducing lens 64 pass through a pre sub deflector 93', a pre main deflector 95', a sub deflector 93, a main deflector 95 and an objective lens 66 to be reduced and projected on the top face of the wafer 14 which is mounted on an XY stage (not shown). The position irradiated with the beams with respect to the position of a pattern to be written on the wafer is controlled by means of the main deflector 95 and the sub deflector 93. In addition, the control voltage of the pre main deflector 95' with respect to the main deflector 95 is controlled in an addition direction, and the control voltage of the pre sub deflector 93' is controlled in a subtraction direction, so that total aberration is minimized. The trajectories of the beams downstream of the second shaping aperture 19 are shown in FIG. 12.

Since the electron optical system of the electron beam lithography system 110 shown in FIG. 11 uses the Einzel lenses in its reducing projecting optical system, the electron beams 67 pass through trajectories which are rotation-symmetric with respect to the optical axis as shown in FIG. 12. The pre main deflector 95', the main deflector 95, the pre sub deflector 93' and the sub deflector 93 are then associated with each other for deflecting all of the trajectories of the electron beams 67 at the same deflection sensitivity and for causing the produced deflection aberration to be rotation-symmetric with respect to the optical axis. Therefore, the electron beam lithography system 110 is characterized in that it is possible to optimize deflection aberration characteristics in an arbitrary position of trajectories of electron beams to determine the positions of the main and sub deflectors.

However, in the reducing projecting optical system of the electron beam lithography system 110, crossovers 98 and 99 with a high current density are formed downstream of the second shaping aperture 19 as shown in FIG. 12. In addition, this projecting optical system adopts the rotation-symmetry type electrostatic lenses (Einzel lenses) 93 and 95 in a deceleration type focusing mode, the electron beams decelerate in the lenses. These two points cause the beams to blur in the electron beam lithography system 110 shown in FIG. 11 due to chromatic aberration and space-charge effect (particularly, Boersch effect) and the cell aperture image on the wafer to blur, so that there is a problem in that writing characteristics deteriorate.

In order to eliminate the above described problems in the electron beam lithography system of the aperture system using low-accelerating-voltage electron beams, a charged particle beam lithography system having a reducing projecting optical system with a multiple multi-pole lens has been proposed (Japanese Patent laid open No. 2001-093825). An embodiment of the charged particle beam lithography system proposed in Japanese Patent laid open No. 2001-093825 is shown in FIG. 13. In comparison with the electron beam lithography system 100 shown in FIG. 11, the electron beam lithography system 100 shown in FIG. 13 is characterized in that the reducing projecting optical system downstream of the second shaping aperture 19 in the electron optical system is designed with an electrostatic quadrupole lens. A pre main deflector 25a is provided between Q2 and Q3 of an electrostatic quadrupole lens 73.

In the electron beam lithography system 100, the operation after electrons are emitted and are accelerated at an electron gun 11 to be electron beams 68 and until the electron beams 68 pass through an illumination optical system is substantially the same as that of the electron beams 67 of the electron beam lithography system 110 shown in FIG. 11.

After the electron beams pass through the second shaping aperture 19, the interior of the electrostatic quadrupole lens 73 of the reducing projecting lens is irradiated with the electron beams. The quadrupole lens 73 comprises fourth cylindrical electrodes which are provided at angular intervals of 90 degrees. By the action of the quadrupole lens 73, the electron beams pass through different trajectories in X and Y directions to be condensed on a wafer 14. The trajectories of the electron beams between the second shaping aperture 19 and the wafer 14 at that time are shown in FIG. 14. By means of the deflector 25, the incident position in a region to be written (a main field) on the wafer 14 mounted on an XY stage (not shown) is deflected and controlled while referring to the position of the XY stage, and the incident position of range to be written which is obtained by dividing the interior of a stripe (a sub field) is controlled. By adjusting the deflecting voltage ratio of the deflector 25, aberration components produced by deflection are controlled so as to be minimized.

However, if the multi-pole lens is applied to the electrostatic lens of the reducing projecting optical system as the electron beam lithography system 100 shown in FIG. 13 and if electron beams are deflected both in the X and Y directions by means of the same deflector, the electron beams in the X directions and the electron beams in the Y directions pass through asymmetric electron trajectories in a wide-range beam deflection over the wafer by the deflector. Therefore, deflection sensitivity and deflection aberration are greatly asymmetric. In such an optical system, the suppression of the deflection aberration in both of the X and Y directions and the realization of a wide range deflection with high sensitivity impose a great burden on design and fabrication, deteriorate aberration characteristics, and increase the influence of the space-charge effect due to an increase of the optical length.

Moreover, in these optical systems, the electron beams passing through the second shaping aperture 19 form the crossover 98 with a high electron density. Therefore, the Coulomb interaction is conspicuous in this region, so that there is a problem in that the space-charge effect causes the blurring of the cell aperture image to deteriorate writing characteristics.

SUMMARY OF THE INVENTION

According to the present invention, there is provided a charged particle beam exposure system comprising: a charged particle beam emitting device which generates charged particle beams with which a substrate is irradiated, the charged particle beam emitting device generating the charged particle beams at an accelerating voltage which is lower than that at which an influence of a proximity effect occurs, the proximity effect being a phenomenon in which a secondary charged particle and/or a reflected charged particle which is/are produced from the surface of the substrate irradiated with the charged particle beams influence(s) an exposure extent of a pattern which is adjacent to a pattern to be written; an illumination optical system which adjusts a beam diameter of the charged particle beams so that density of the charged particle beams is uniform; a character aperture in which an aperture hole is formed in a shape corresponding to a desired pattern to be written; a first deflector which deflects the charged particle beams by an electrostatic field that the charged particle beams have a desired sectional shape and travel towards a desired aperture hole and which returns the charged particle beams passing through the aperture hole to an optical axis thereof; a reducing projecting optical system which forms a multi-pole lens field so that the charged particle beams passing through the character aperture substantially reduce at the same demagnification both in X and Y directions when the optical axis extends in Z directions and form an image on the substrate without forming any crossover between the character aperture and the substrate; and a second deflector which deflects the charged particle beams passing through the character aperture by means of an electrostatic field to scan the substrate with the charged particle beams.

BRIEF DESCRIPTION OF THE DRAWINGS

In the drawings:

FIGS. 5A through 5C are illustrations for explaining a method for forming a lens electrostatic field with quadrupole lenses Q3 and Q4 shown in FIG. 1;

FIGS. 6A through 6C are illustrations for explaining a method for forming a deflecting electrostatic field with quadrupole lenses Q3 and Q4 shown in FIG. 1;

FIGS. 7A through 7C are illustrations for explaining a method for forming a deflecting electrostatic field with quadrupole lenses Q3 and Q4 shown in FIG. 1;

DETAILED DESCRIPTION OF THE INVENTION

Referring now to the accompanying drawings, some embodiments of the present invention will be described below. In any of the following embodiments, an electron beam exposure system for writing a pattern on a wafer using electron beams will be described as a charged particle beam exposure system.

(1) First Embodiment

Figure 1:
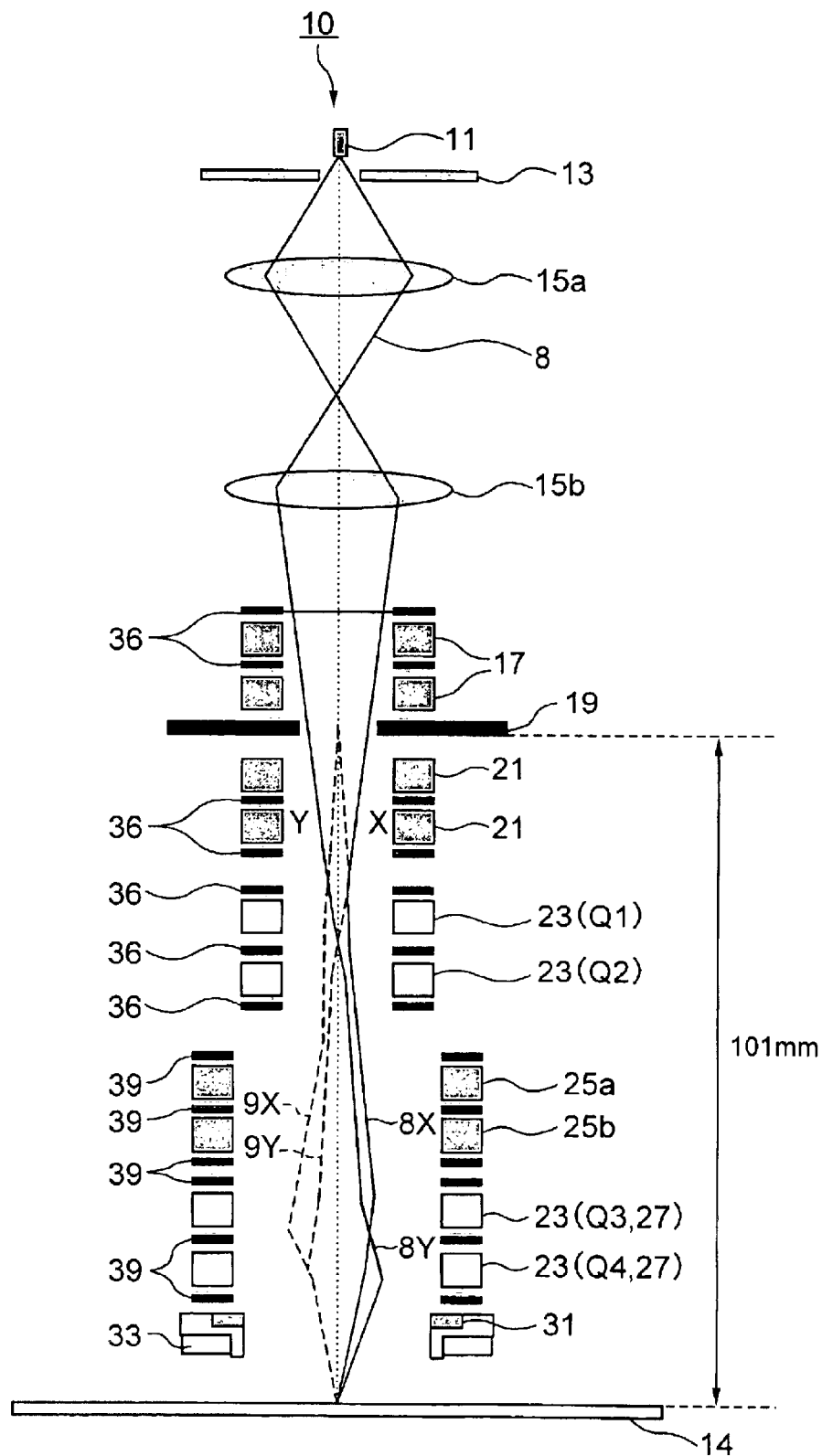
FIG. 1 is a schematic construction drawing showing an electron optical system of the first embodiment of a charged particle beam exposure system according to the present invention.
Figure 2A:
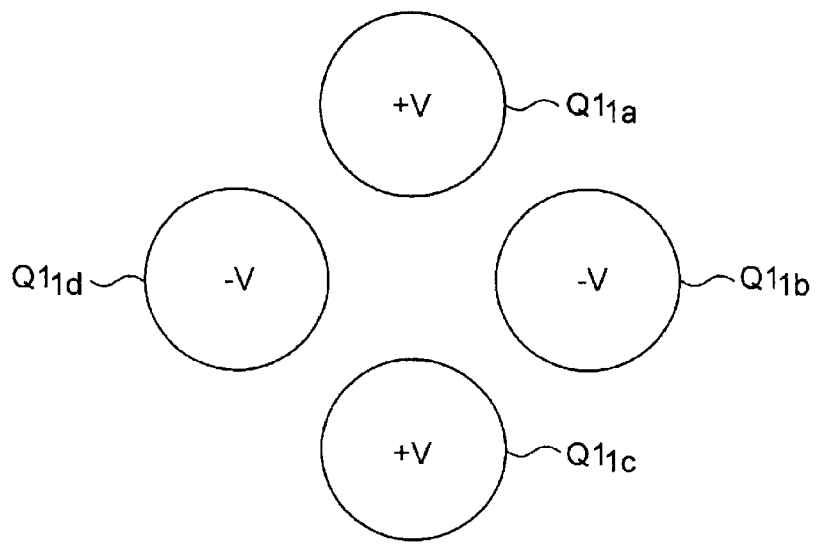
FIGS. 2A through 2C are plan views for explaining the shape of the electrodes of a multi-pole lens of the charged particle beam exposure system shown in FIG. 1.
Figure 2B:
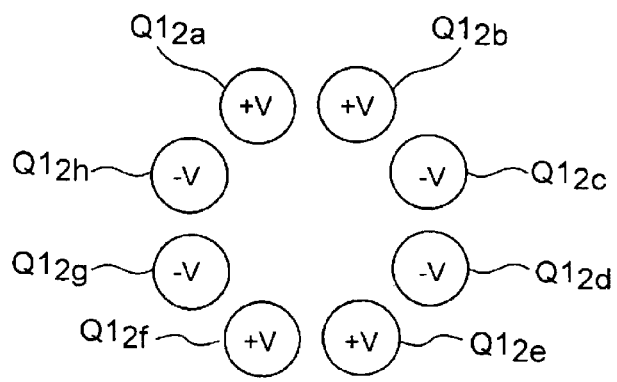
Figure 2C:
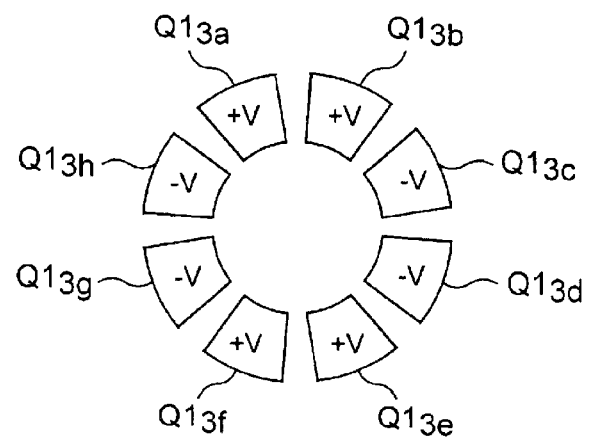

FIG. 1 is a schematic construction drawing showing an electron optical system of the first embodiment of a charged particle beam exposure system according to the present invention. As shown in this figure, this embodiment is characterized by the construction of electrostatic lenses and the construction of a reducing projecting optical system. That is, in an electron beam exposure system 10 shown in FIG. 1, all of electrostatic lenses except for illumination lenses 15a and 15b, i.e., a first shaping deflector 17, a second shaping deflector 21, electrostatic lenses 23Q1 through Q4 for controlling trajectories of electron beams independently in X and Y directions, a pre main deflector 25 and a sub deflector 31 comprise electrostatic multi-pole lenses. Each of these multi-pole lenses comprises eight electrodes which are arranged at angular intervals of 45 degrees. Referring to FIGS. 2A through 2C, the concrete shape of a multi-pole lens of the electron beam exposure system 10 in this embodiment will be described below.

FIG. 2A shows a quadrupole lens with four electrodes. The electrodes $Q1_{1a}$ through $Q1_{1d}$ of a quadrupole lens in this figure are formed in a cylindrical shape respectively and arranged at angular intervals of 90 degrees. FIG. 2B shows an example of a quadrupole lens comprising eight electrodes, and shows eight cylindrical electrodes $Q1_{2a}$ through $Q1_{2h}$ which are arranged at angular intervals of 45 degrees. FIG. 2C is a plan view showing the construction of a multi-pole lens 23Q1 of the charged particle beam exposure system 10 in this embodiment, and typically shows the construction of electrostatic deflectors 17, 21, 25 and 31 and electrostatic lenses 23. The multi-pole lens 23 comprises eight electrodes $Q1_{3a}$ through $Q1_{3h}$ which are arranged at angular intervals of 45 degrees. Each of the electrodes is formed in a sector plane shape.

In this embodiment, adjacent two of the eighth electrodes of the multi-pole lens 23 are used as a single quadrupole electrode so that the whole multi-pole lens 23 operates as a quadrupole lens. For example, a voltage of +V is applied to the electrodes $Q1_{3a}$ and $Q1_{3b}$, so that these electrodes are controlled so as to function as the electrode $Q1_{1a}$ shown in FIG. 2A. Then, in the following description the multi-pole lens 23 will be suitably described as the quadrupole lens 23.

Referring to FIG. 1 again, the reducing projecting optical system of the charged particle beam exposure system 10 comprises: electrostatic quadrupole lenses 23Q1 through 23Q4, the quadrupole lenses 23Q1 and 23Q2 being provided upstream of the pre main deflectors 25a and 25b, and the quadrupole lenses 23Q3 and 23Q4 being provided downstream of the pre main deflectors 25a and 25b; a sub deflector 31 which is provided between Q4 of the fourth quadrupole lens 23 and a wafer 14; and shielding electrodes 36 and 39 which are arranged in the vicinity of the top and bottom faces of the first shaping deflector 17, the second shaping deflector 21, the pre main deflectors 25a and 25b, and the quadrupole lenses 23Q1 through Q4 in directions of the optical axis.

Figure 13:
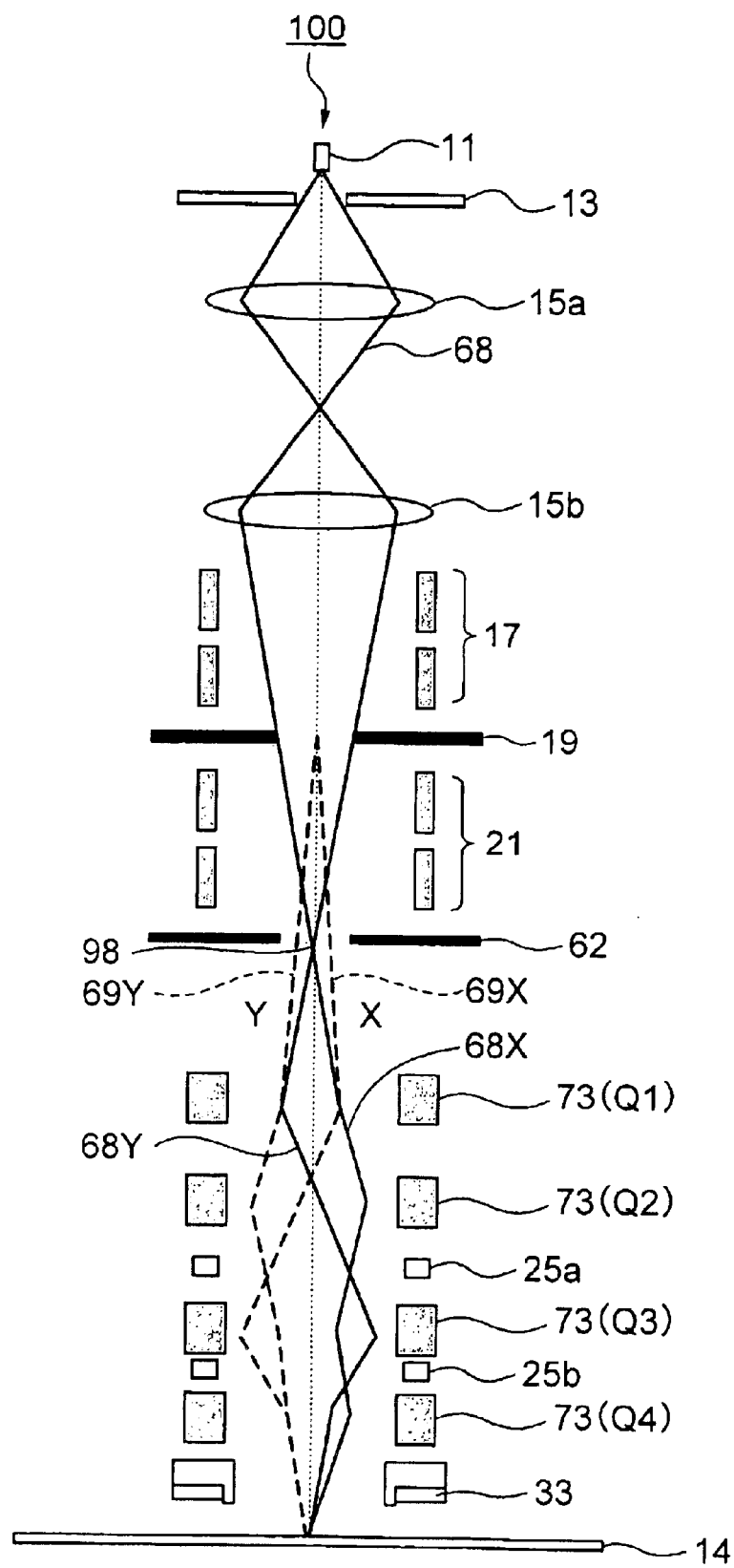
FIG. 13 is a schematic construction drawing showing an embodiment of a conventional charged particle beam lithography system of an aperture system using low-accelerating-voltage electron beams.
Figure 14:
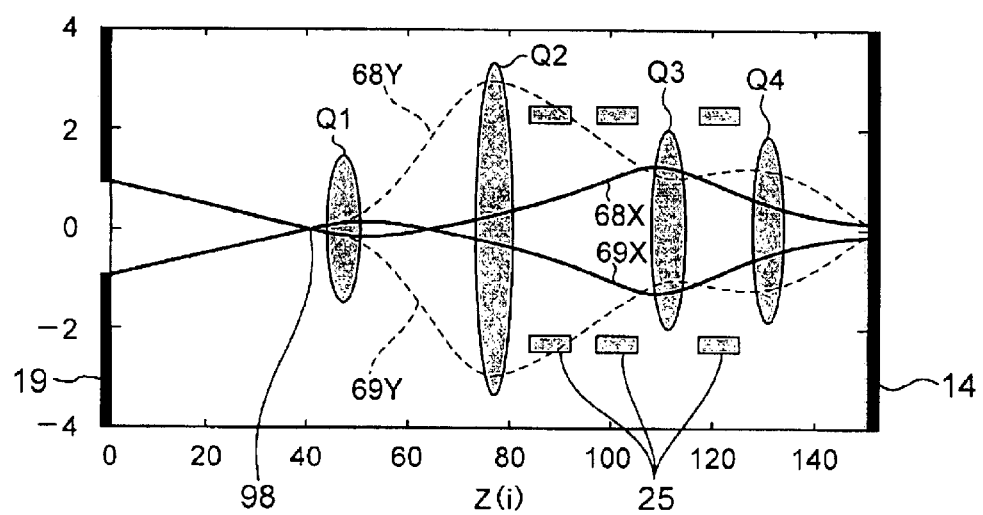
FIG. 14 is an illustration showing the trajectories of electron beams in an electrostatic quadrupole lens optical system of the electron beam lithography system shown in FIG. 13.

The shielding electrode 36 is formed with an inside diameter Φ1 of 5 mm and the shielding electrode 39 is formed with an inside diameter Φ2 of 10 mm. These shielding electrodes 36 and 39 are connected to the ground to adequately eliminate the possibility that electrostatic fields formed by the respective lenses or deflectors interface with each other. As a result, as can be clearly seen from the comparison with FIG. 13, in this embodiment, all of the first shaping deflector 17, the second shaping deflector 21 and the first and second quadrupole lenses Q1 and Q2 are formed with the same inside diameter Φ1 (5 mm) as the inside diameter of the shielding electrode 36.

The third quadrupole lens Q3 and fourth quadrupole lens Q4 of the quadruple quadrupole lenses 23 are designed so that the diameters thereof are greater than those of the first and second quadrupole lenses Q1 and Q2. Specifically, the inside diameter of Q1 and Q2 is $\Phi_1$=5 mm as shown in FIG.

Figure 3A:
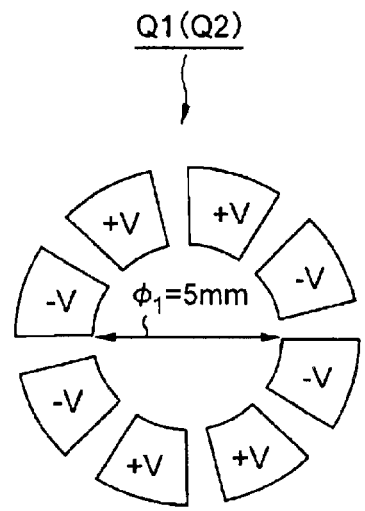
FIGS. 3A and 3B are plan views for explaining the difference in inside diameter in multi-pole lenses of the charged particle beam exposure system shown in FIG. 1.
Figure 3B:
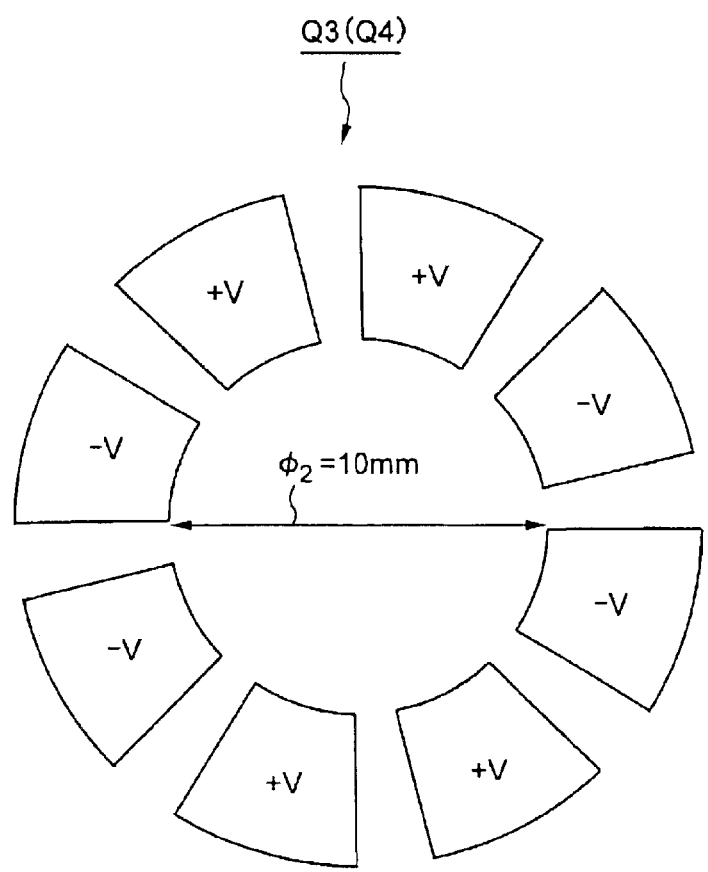

3A and the inside diameter $\Phi_2$ of Q3 and Q4 is 10 mm as shown in FIG. 3B. As will be described later, the quadrupole lenses Q3 and Q4 form a multi-pole lens field for independently controlling X and Y trajectories of electron beams 8, and also serve as a main deflector 27 for superimposing a deflecting electrostatic field on the multi-pole lens field. The shielding electrodes 36 and 39 are connected to the ground to prevent the leaching of the electrostatic field excited by the respective electrodes. Other constructions of the electron beam exposure system 10 are substantially the same as those of the electron beam lithography system 100 shown in FIG. 13.

The operation of the electron beam exposure system shown in FIG. 1 is as follows.

The electron beams 8 are emitted from the electron gun 11 to be accelerated and the first aperture 13 having the rectangular or circular opening is irradiated with the electron beams 8. The electron beams 8 passing through the first aperture 13 travel toward the second shaping aperture 19 in which a plurality of bulk exposure cell apertures are arranged. The beam diameter of the electron beams 8 is adjusted to such a size that it is sufficiently greater than an any one of the cell apertures and that the electron beams 8 do not interfere with adjacent cell patterns. The trajectories of the electron beams 8 are deflected and controlled by the first shaping deflector 17 so that a target aperture of the cell apertures formed in the second shaping aperture 19 is irradiated with the electron beams 8.

The electron beams 8 passing through the second shaping aperture 19 start as cell pattern beams starting at the second shaping aperture 19 and are returned to the optical axis by means of the second shaping deflector 21 to illuminate the interior of the quadrupole 23.

Figure 4:
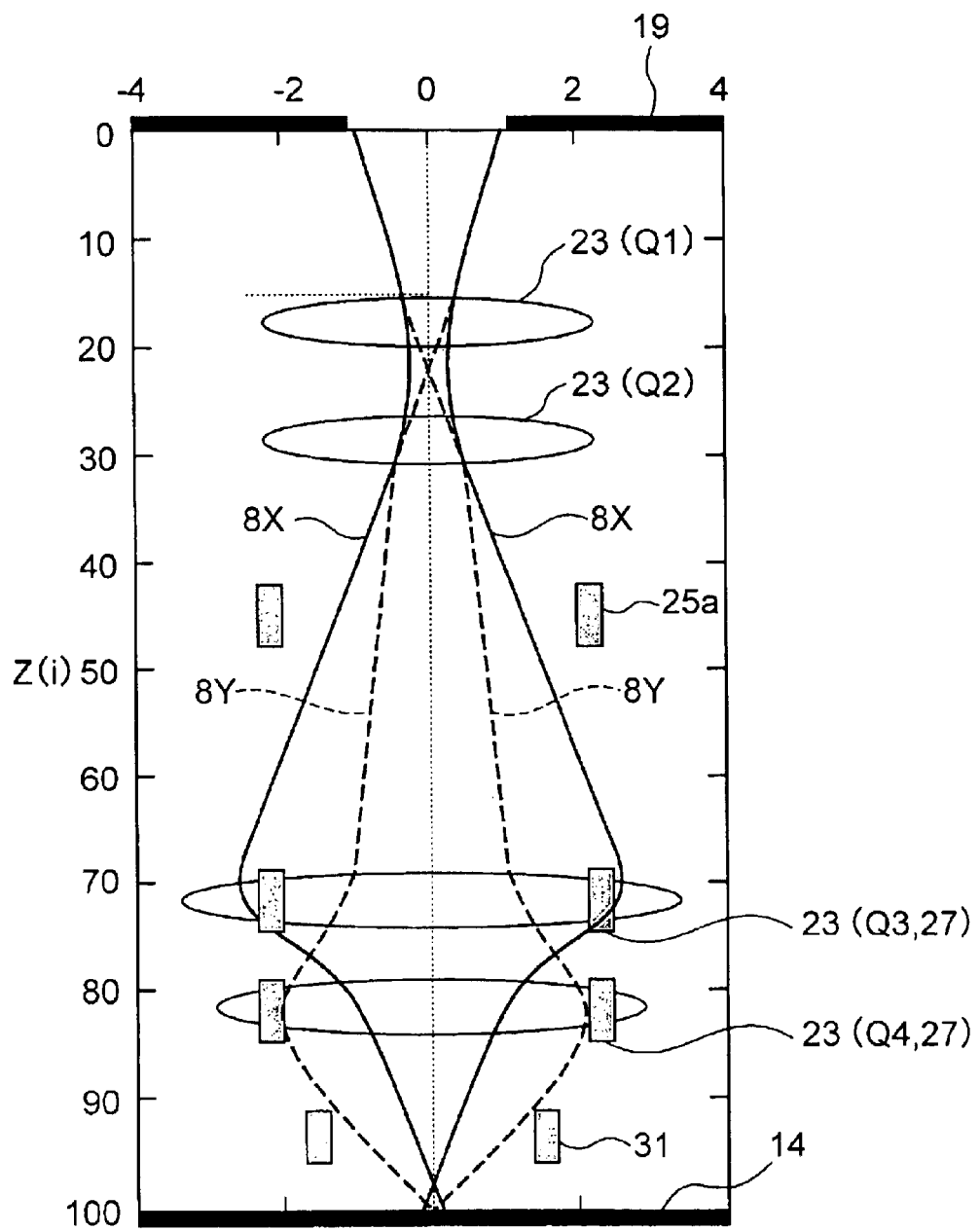
FIG. 4 is an illustration showing the trajectories of electron beams in a reducing projecting optical system of the charged particle beam exposure system shown in FIG. 1.
Figure 12:
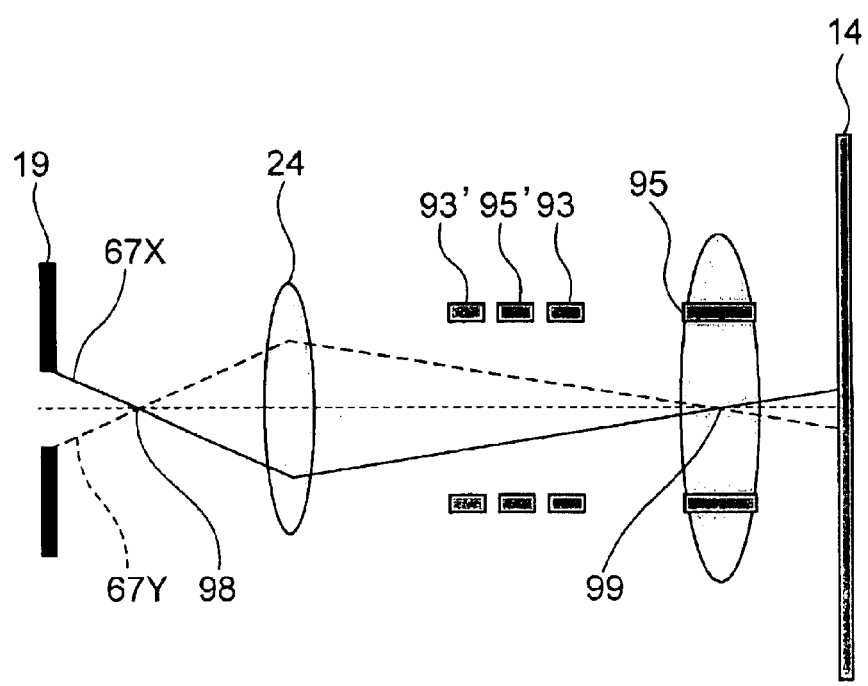
FIG. 12 is an illustration showing trajectories of beams in the reducing projecting optical system of an electron beam lithography system shown in FIG. 11.

For example, assuming that the optical axis of the electron beams 8 extends in Z directions, a voltage is applied to the quadruple quadrupole lenses 23 so as to form such electrostatic fields in the X and Y directions, i.e., if the first through fourth electrostatic fields in the X directions are sequentially a divergent electrostatic field (Q1), a divergent electrostatic field (Q2), a convergent electrostatic field (Q3) and a divergent electrostatic field (Q4), the electrostatic fields in the Y directions are a convergent electrostatic field (Q1), a convergent electrostatic field (Q2), a divergent electrostatic field (Q3) and a convergent electrostatic field (Q4) by contraries. When the quadrupole lenses 23 are thus controlled, the trajectories of the electron beams 8 from the second shaping aperture 19 to the wafer 14 are shown in FIG. 4. As can be clearly seen from the comparison with FIG. 12, the electron beams 8 pass through different trajectories in the X and Y directions by means of Q1 through Q4 of the quadrupole lenses 23. This point is the same as the electron beam lithography system 100. However, in this embodiment, by means of Q1 and Q2 of the quadrupole lenses 23, the electron beam trajectory 8X in the X directions repeats divergence, and on the other hand, the electron beam trajectory 8Y in the Y directions repeats convergence, so that the electron beams 8 are condensed on the wafer 14 without forming any crossovers with a high electron density. As a result, in the low acceleration electron beam exposure, the influence of the space-charge effect can be substantially reduced. Furthermore, in this embodiment, only the pre main deflector 25a and 25b is used for controlling the beam trajectories.

Referring to FIG. 1 again, a position of the region to be written (main field) on the wafer 14 illuminated with the electron beams 8 can controlled by the pre main deflector 25a and the main deflector 27 while referring to the position of the XY stage (not shown) on which the wafer 14 is mounted. The position of the range to be written which is obtained by finely dividing the interior of the stripe (sub field) is controlled by the sub deflector 31. In this embodiment, the quadrupole lenses Q3 and Q4 also serve as the main deflector 27. This is realized by superimposing a deflecting electrostatic field on an electrostatic field which serves to control the trajectories in the X and Y directions by Q3 and Q4 of the quadrupole lenses 23. FIGS. 5A through 7C show examples of electrostatic field superimposing methods. FIGS. 5A through 5C show voltage values which are applied to the respective electrodes of Q3 and Q4 of the quadrupole lenses 23 only for controlling the trajectories of the electron beams 8 in the X and Y directions. In this case, the voltage value applied to the pre main deflector 25a is 0. FIGS. 6A through 6C show the values of voltages which are applied to the pre main deflector 25a and the respective electrodes of Q3 and Q4 of the quadrupole lenses 23 only when the electron beams 8 are deflected in the X directions. FIGS. 7A through 7C show voltage values which are applied to the respective electrodes when the electrostatic field obtained by the voltage values shown in FIGS. 5A through 5C is superimposed on the electrostatic field obtained by the voltage values shown in FIGS. 6A through 6C respectively. The voltage values shown in FIGS. 7A through 7C are equal to voltage values which are obtained by adding the voltage values shown in FIGS. 5A through 5C to the voltage values shown in FIGS. 6A through 6C, respectively. By controlling such voltages, the deflection and control of the electron beams can be realized with the minimum construction. FIGS. 5A through 7C show the control methods for deflecting the electron beams in the X directions. The deflection and control in the Y directions can be realized by rotating the deflecting voltages of FIGS. 6B and 6C by 90 degrees, respectively, and setting all of the deflecting voltages $V_1$ of the pre main deflector 25a to be zero. If a voltage obtained by adding the control voltage in the X directions to the control voltage in the Y directions is applied, it is possible to deflect the electron beams to a direction in which the electron beams are inclined at 45 degrees (diagonal direction).

Thus, according to the electron beam exposure system 10 in this embodiment, the aberration components of the electron beams 8 can be minimized by adjusting the ratio of the deflecting voltage of the pre main deflector 25 to that of Q3 and Q4 of the quadrupole lenses 23 serving as the main deflector 27.

Figure 8:
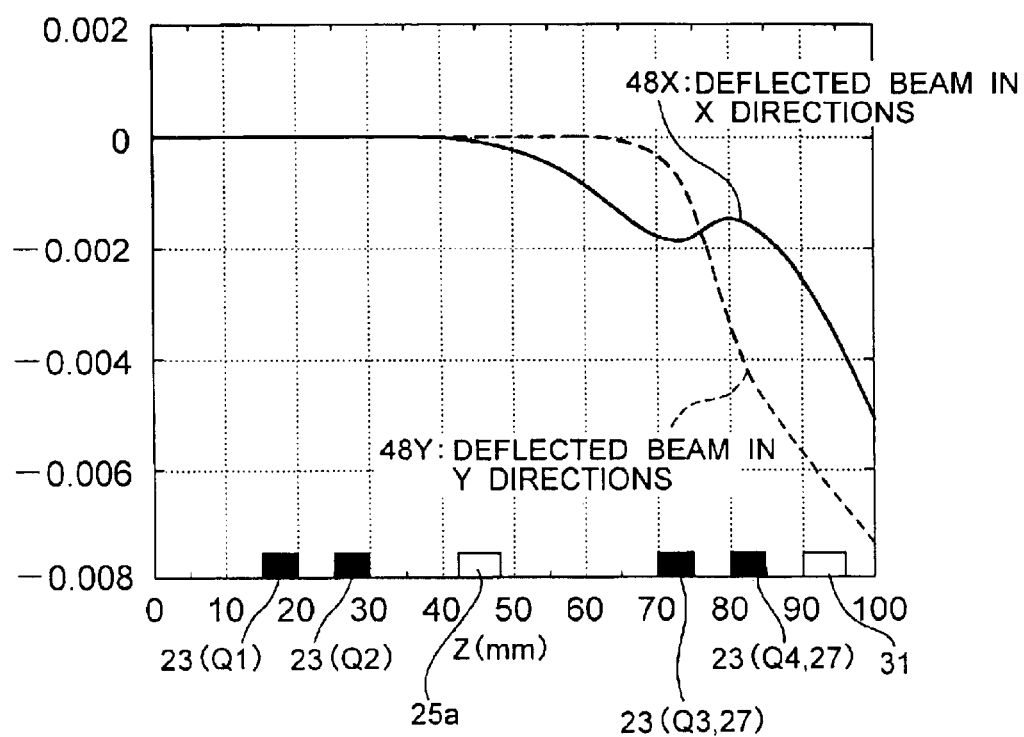
FIG. 8 is a beam trajectory diagram for explaining a method for deflecting and controlling electron beams independently in X and Y directions in a reducing projecting optical system of the charged particle beam exposure system shown in FIG. 1.

The deflection of the electron beams can be independently carried out in the X and Y directions. For example, as shown in FIG. 8, the electron beams 48X in the X directions are deflected by means of the pre main deflector 25a, the main deflector 27 (Q3 and Q4 of the quadrupole lenses 23) and the sub deflector 31, and on the other hand, the electron beams 48Y in the Y directions are deflected only by means of the main deflector 27 (Q3 and Q4 of the quadrupole lenses 23) and the sub deflector 31, so that it is possible to further reduce deflection aberration. In this case, the aberration components of the electron beams 8 can be minimized by adjusting the deflecting voltage ratio between the pre main deflector 25, Q3 and Q4 of the quadrupole lenses 23 serving as the main deflector 27, and the sub deflector 31.

If the wafer 14 is irradiated with the electron beams 8, secondary electrons and so forth are produced on the surface of the wafer 14. The secondary electron detector 33 provided below the quadrupole 23 is designed to detect these secondary electrons and so forth, and the electron beam exposure system 10 is designed to process the detection signals from the secondary electron detector 33 to detect a SEM image and to adjust the beams and the like.

According to the electron beam exposure system 10 in this embodiment, the quadruple quadrupole lenses Q1 through Q4 are used for forming the multi-pole lens field, so that it is possible to avoid deceleration in lenses occurring in conventional rotation-symmetric decelerating electrostatic lenses. Since the beam trajectories of the low acceleration electron beams 8 passing through the second shaping deflector 21 are controlled independently in the X and Y directions respectively by means of the multi-pole lens field, the electron beams 8 can be condensed on the wafer 14 without forming any crossover with a high current density. Thus, it is possible to greatly remove the influence of the space-charge effect even at a low acceleration. Since the multi-pole lens with eight electrodes is operated as a quadrupole lens, it is possible to greatly reduce high-order aberration of deflection. Since the deflection electrostatic field is superimposed on the multi-pole lens field of the quadrupole lenses Q3 and Q4 to operate the quadrupole lenses Q3 and Q4 also as the main deflector, so that it is possible to reduce the optical length of the reducing projecting optical system. Since the inside diameters of the quadrupole lenses Q3 and Q4 are designed to be greater than those of Q1 and Q2, it is possible to form the trajectories of the electron beams in a region except for the vicinity of the electrodes. Thus, it is possible to further suppress deflection aberration.

Moreover, since the shielding electrodes 36 and 39, which are ground electrodes, are arranged in close vicinity of both ends of the quadrupole lenses Q1 through Q4 in Z directions, it is possible to prevent the leaching of the electrostatic field from the respective electrodes. Thus, since the possibility of causing interference between the respective electrostatic fields is eliminated, it is possible to further shorten the optical length of the electron optical system, and it is possible to further improve deflection sensitivity. By using the optical system with the above described construction and the above described deflection control method, it was achieved to realize an electron beam exposure system wherein, for example, under a stigmatic condition of a reduction ratio of 1/10 in both of X and Y directions, the optical length between the second shaping aperture 19 and the wafer 14 is 101 mm (see FIG. 1) while the quadrupole lens length (length in Y directions) is 6 mm, the main deflection area is 1.5 mm□ and the sub deflection function is 50 μm□.

(2) Second Embodiment

Figure 9:
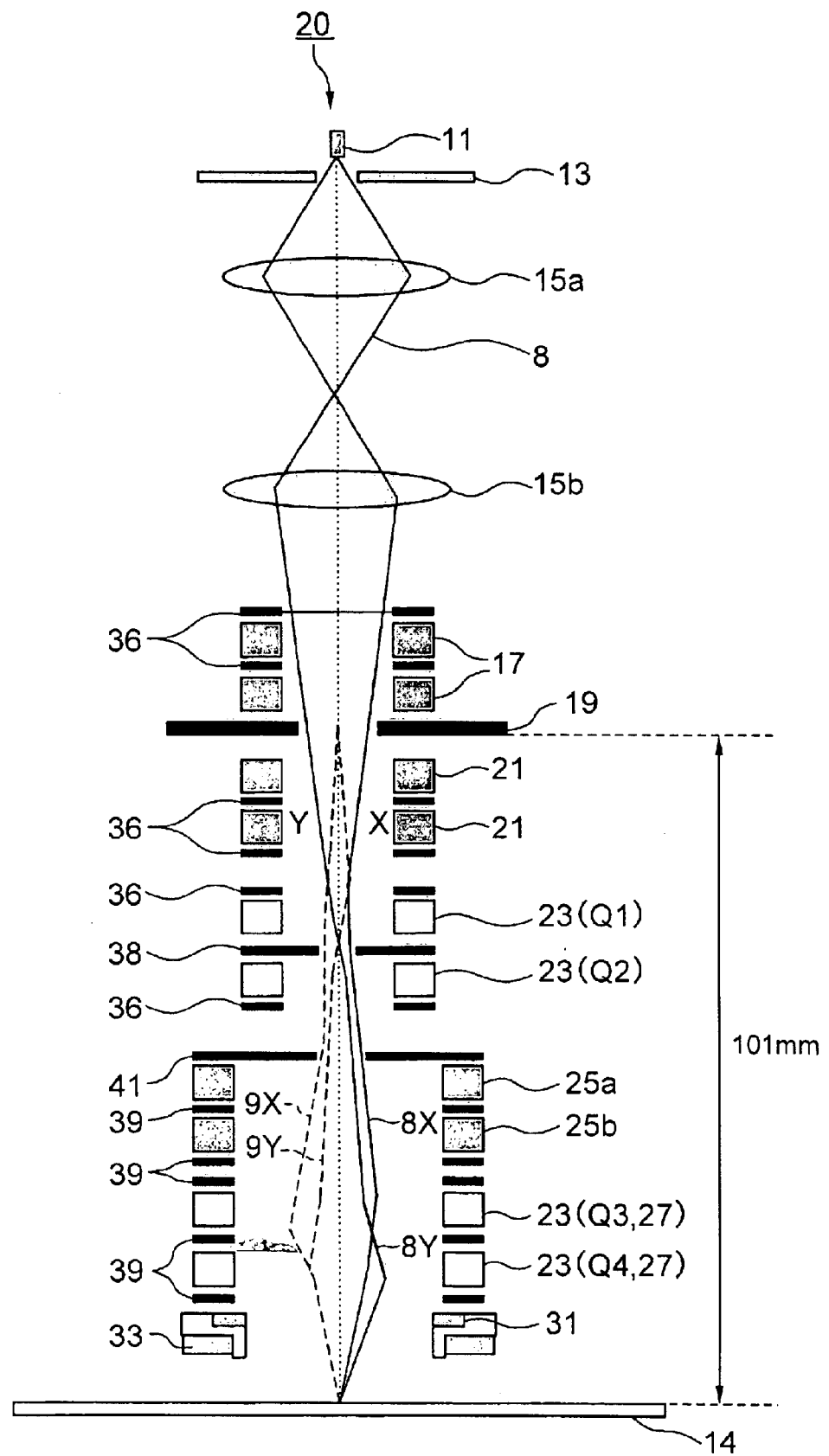
FIG. 9 is a schematic construction drawing showing an electron optical system of the second embodiment of a charged particle beam exposure system according to the present invention.
Figure 10:
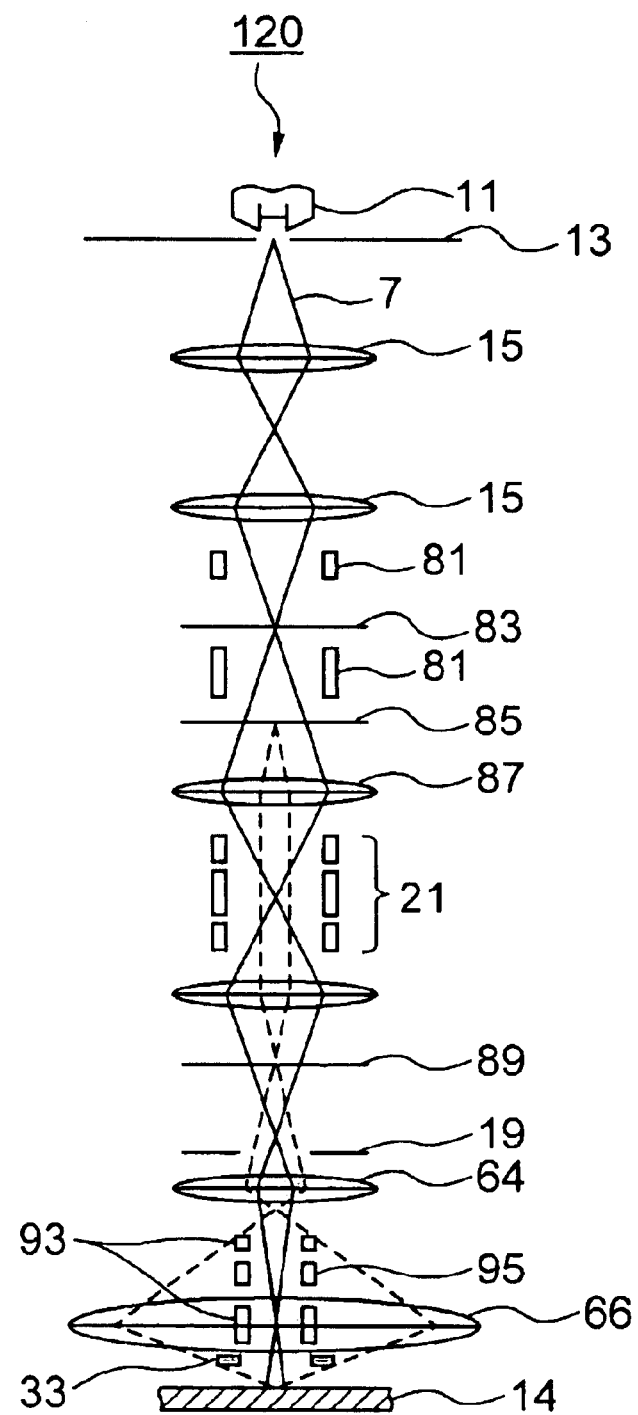
FIG. 10 is a schematic construction drawing showing a typical example of a conventional electron beam lithography system of a VSB writing system.
Figure 11:
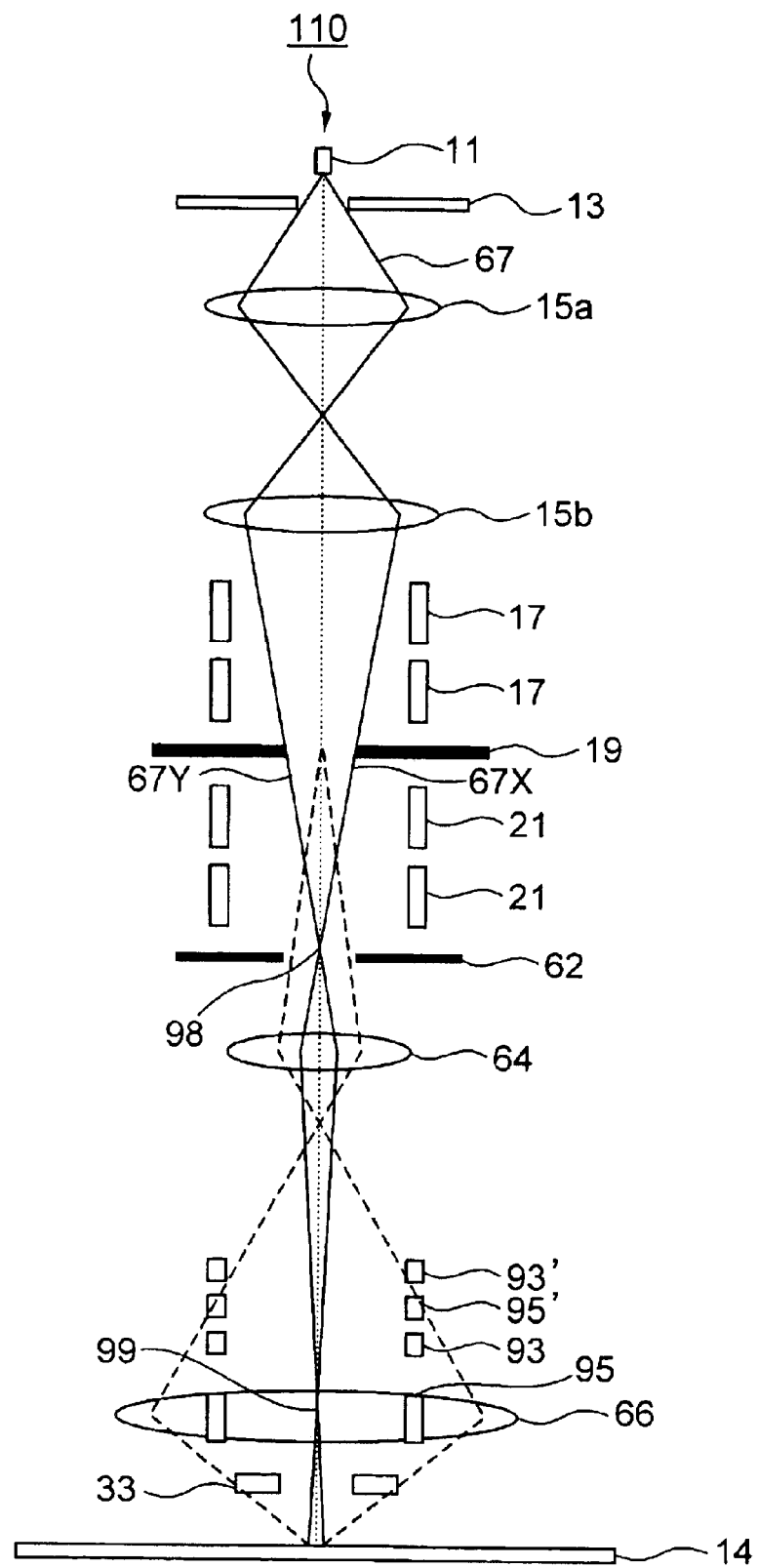
FIG. 11 is a schematic construction drawing showing an example of a conventional electron beam lithography system of an aperture system using low-accelerating-voltage electron beams.

FIG. 9 is a schematic construction drawing showing an electron optical system of the second embodiment of a charged particle beam exposure system according to the present invention. As can be clearly seen from the comparison with FIG. 1, the charged particle beam exposure system 20 in this embodiment is characterized in that a shielding electrode 41 is provided upstream of the pre main deflector 25a, and a shielding electrode 38 is further provided between Q1 and Q2 of the quadrupole lenses 23 in place of the shielding electrode 36. Other constructions of the charged particle beam exposure system 20 are substantially the same as those of the charged particle beam exposure system 10 shown in FIG. 1.

The inside diameter of the shielding electrode 38 is designed so as to be smaller than those of adjacent two shielding electrodes, i.e., the shielding electrodes 36 which are provided upstream of the quadrupole lens 23Q1 and downstream of the quadrupole lens 23Q2. For example, when the inside diameter $\Phi_1$ of the shielding electrode 36 is 5 mm, the inside diameter $\Phi_3$ of the shielding electrode 38 is designed to be 200 μm. Thus, the shielding electrode 38 can be used as a beam aligning aperture for the illumination lenses 15a and 15b, the first shaping deflector 17, the second shaping deflector 21 and Q1 of the quadrupole lenses 23, or as a detector for the electron beams 8.

Similar to the shielding electrode 38, the inside diameter of the shielding electrode 41 is smaller than that of each of other shielding electrodes 36 and 39, and for example, the inside diameter of the shielding electrode 41 is $\Phi_4$=200 μm. Due to such a small inside diameter, the shielding electrode 41 can be used as a beam aligning aperture for the illumination lenses 15a and 15b, the first shaping deflector 17, the second shaping deflector 21 and Q1 and Q2 of the quadrupole lenses 23, or a detector for the electron beams 8.

Since the operation of the electron beam exposure system 20 is substantially the same as the operation of the electron beam exposure system 10 shown in FIG. 1, the detailed description thereof is omitted.

While the embodiments of the present invention have been described above, the present invention should not be limited to these embodiments, and the invention can be embodied in various ways without departing from the scope thereof. For example, while all of the quadrupole lenses 23 comprise octpole electrodes to produce a quadrupole field in the above described embodiments, Q1 and Q2 of the quadrupole lenses 23 may comprise four electrodes, and only Q3 and Q4 of the quadrupole lenses 23 for superimposing deflection fields may comprise octpole electrodes as shown in FIG. 2B or 2C. In addition, Q3 and Q4 of the quadrupole lenses 23 should not be limited to octpole electrodes, but they may comprise a multi-pole wherein the number of poles is M (M=4$N_2$, $N_2$ is a natural number of 2 or more). If the multi-pole having the greater number of poles is thus used, it is possible to reduce high-order components in the deflection field and to minimize deflection aberration. While electron beams are used as charged particle beams in the above described embodiments, the present invention should not be limited thereto, but the invention may be generally applied to a charged particle beam exposure system using ion beams as charged particle beams.

What is claimed is:

1. A charged particle beam exposure system comprising:
   a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;
   an illumination optical system which adjusts a beam diameter of the charged particle beams so that a density of the charged particle beams is uniform;
   a character aperture in which an aperture hole is formed in a shape corresponding to a desired pattern to be written;
   a first deflector which deflects the charged particle beams by an electrostatic field so that the charged particle beams have a desired sectional shape and travel towards a desired aperture hole and which returns the charged particle beams passing through said aperture hole to an optical axis thereof;
   a reducing projecting optical system which forms a multipole lens field so that the charged particle beams passing through said character aperture substantially reduce at the same demagnification both in X and Y directions when the optical axis extends in Z directions and form an image on the substrate without forming any crossover between said character aperture and the substrate; and
   a second deflector which deflects the charged particle beams passing through said character aperture by means of an electrostatic field to scan the substrate with the charged particle beams.

2. A charged particle beam exposure system according to claim 1, wherein said reducing projecting optical system includes multi-pole lenses the number of which is $N_1$, $N_1$ being a natural number of 3 or more.

3. A charged particle beam exposure according to claim 2, wherein said second deflector deflects the charged particle beams in the X directions and the charged particle beams in said Y directions independently of each other.

4. A charged particle beam exposure system according to claim 3, wherein said $N_1$ is 4.

5. A charged particle beam exposure system comprising:
a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;
an illumination optical system which adjusts a beam diameter of the charged particle beams so that a density of the charged particle beams is uniform;
a character aperture in which an aperture hole is formed in a shape corresponding to a desired pattern to be written;
a first deflector which deflects the charged particle beams by an electrostatic field so that the charged particle beams have a desired sectional shape and travel towards a desired aperture hole and which returns the charged particle beams passing through said aperture hole to an optical axis thereof;
a reducing projecting optical system which forms a multi-pole lens field so that the charged particle beams passing through said character aperture substantially reduce at the same demagnification both in X and Y directions when the optical axis extends in Z directions and form an image on the substrate without forming any crossover between said character aperture and the substrate,
wherein said reducing projecting optical system includes four multi-pole lenses; and
a second deflector which deflects the charged particle beams passing through said character aperture by means of an electrostatic field to scan the substrate with the charged particle beams,
wherein said second deflector deflects the charged particle beams in the X directions and the charged particle beams in said Y directions independently of each other, and said four multi-pole lenses are controlled to form first through fourth electrostatic fields so that said first through fourth electrostatic fields sequentially form a divergent electrostatic field, a divergent electrostatic field, a convergent electrostatic field and a divergent electrostatic field in one direction of the X and Y directions and so as to sequentially form a convergent electrostatic field, a convergent electrostatic field, a divergent electrostatic field and a convergent electrostatic field in the other direction of the X and Y directions.

6. A charged particle beam exposure system according to claim 5, wherein said second deflector includes a plurality of electrostatic deflectors.

7. A charged particle beam exposure system according to claim 6, wherein said second deflector superimposes an electrostatic deflection field on said multi-pole lens field to deflect the charged particle beams.

8. A charged particle beam exposure system according to claim 7, which further comprises a first main deflector which includes multi-pole electrodes, said first main deflector being provided between a second multi-pole lens and a third multi-pole lens of said first multi-pole lenses,
wherein said multi-pole lens is controlled to form first through fourth electrostatic fields so that said first through fourth electrostatic fields sequentially form a divergent electrostatic field, a divergent electrostatic field, a convergent electrostatic field and a divergent electrostatic field in the X directions and to sequentially form a convergent electrostatic field, a convergent electrostatic field, a divergent electrostatic field and a convergent electrostatic field in the Y directions,
said third multi-pole lens and said fourth multi-pole lens serve as a second main deflector for superimposing an electrostatic deflection field on said multi-pole lens field, and
said second deflector includes said first main deflector and said second main deflector, said second deflector deflecting the charged particle beams independently in said X and Y directions by deflecting the charged particle beams in the X directions by a first main deflection field formed by said first main deflector and a second main deflection field formed by said second main deflector and deflecting the charged particle beams in the Y directions by said second main deflection field.

9. A charged particle beam exposure system according to claim 8, wherein said second deflector further includes a sub deflector downstream of said $N_1$-th multi-pole lens.

10. A charged particle beam exposure system according to claim 9, wherein said multi-pole lens is an electrostatic lens.

11. A charged particle beam exposure system according to claim 10, wherein said electrostatic lens is a quadrupole lens.

12. A charged particle beam exposure system according to claim 11, wherein said multi-pole lens has M ($M=4N_2$, $N_2$ is a natural number of 2 or more) electrodes, adjacent $N_2$ electrodes thereof serving as a set of quadrupole lenses.

13. A charged particle beam exposure system comprising:
a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;
an illumination optical system which adjusts a beam diameter of the charged particle beams so that density of the charged particle beams is uniform;
a character aperture in which an aperture hole is formed in a shape corresponding to a desired pattern to be written;
a first deflector which deflects the charged particle beams by an electrostatic field so that the charged particle beams have a desired sectional shape and travel towards a desired aperture hole and which returns the charged particle beams passing through said aperture hole to an optical axis thereof;

a reducing projecting optical system which forms a multi-pole lens field so that the charged particle beams passing through said character aperture substantially reduce at the same demagnification both in X and Y directions when the optical axis extends in Z directions and form an image on the substrate without forming any crossover between said character aperture and the substrate, wherein said reducing projecting optical system includes four multi-pole lenses, and the inside diameter of said first multi-pole lens and said second multi-pole lens is a first inside diameter and the inside diameter of said third multi-pole lens and said fourth multi-pole lens is a second inside diameter which is greater than said first inside diameter; and a second deflector which deflects the charged particle beams passing through said character aperture by means of an electrostatic field to scan the substrate with the charged particle beams, wherein said second deflector deflects the charged particle beams in the X directions and the charged particle beams in said Y directions independently of each other.

14. A charged particle beam exposure system according to claim 13, which further comprises a first shielding electrode which is provided in the vicinity of the top and bottom faces of said multi-pole lens in the Z directions.

15. A charged particle beam exposure system according to claim 14, wherein the inside diameter of said first shielding electrode provided between the first multi-pole lens and the second multi-pole lens, of said first shielding electrodes, is a fourth inside diameter smaller than a third inside diameter which is the inside diameter of other first shielding electrode.

16. A charged particle beam exposure system according to claim 15, wherein said first shielding electrode with said fourth inside diameter serves as a first alignment aperture for the charged particle beams or a first detector for the charged particle beams.

17. A charged particle beam exposure system according to claim 16, which further comprises second shielding electrodes which are provided in the vicinity of the top and bottom faces of said first and second deflectors, respectively.

18. A charged particle beam exposure system according to claim 17, wherein the inside diameter of said second shielding electrode provided in the vicinity of the top face of said first main deflector, of said second shielding electrodes, is a fifth inside diameter which is smaller than said third inside diameter.

19. A charged particle beam exposure system according to claim 18, wherein said second shielding electrode with said fifth inside diameter serves as a second alignment aperture for the charged particle beams or a second detector for the charged particle beams.

20. A charged particle beam exposure system according to claim 19, wherein each of the lens lengths of said multi-pole lenses is about 6 mm, said first inside diameter being about 5 mm, said second inside diameter being about 10 mm, and the optical length between said character aperture and the substrate being 110 mm or less.

21. A charged particle beam exposure system comprising:
a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;

an illumination optical system which adjusts a beam diameter of the charged particle beams so that density of the charged particle beams is uniform;

a character aperture in which an aperture hole is formed in a shape corresponding to a desired pattern to be written;

a first deflector which deflects the charged particle beams by an electrostatic field so that the charged particle beams have a desired sectional shape and travel towards a desired aperture hole and which returns the charged particle beams passing through said aperture hole to an optical axis thereof;

a reducing projecting optical system which forms a multi-pole lens field so that the charged particle beams passing through said character aperture form an image on the substrate without forming any crossover between said character aperture and the substrate; and a second deflector which deflects the charged particle beams passing through said character aperture by means of an electrostatic field to scan the substrate with the charged particle beams.

22. A charged particle beam exposure system according to claim 21, wherein said reducing projecting optical system includes four multi-pole lenses which are controlled to form first through fourth electrostatic fields so that said first through fourth electrostatic fields sequentially form a divergent electrostatic field, a divergent electrostatic field, a convergent electrostatic field, and a divergent electrostatic field in one direction of X and Y directions and so as to sequentially form a convergent electrostatic field, a convergent electrostatic field, a divergent electrostatic field, and a convergent electrostatic field in the other direction of the X and Y directions.

23. A charged particle beam exposure system comprising:
a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;

an illumination optical system which adjusts a beam diameter of the charged particle beams so that density of the charged particle beams is uniform;

a character aperture in which an aperture hole is formed in a shape corresponding to a desired pattern to be written;

a first deflector which deflects the charged particle beams by an electrostatic field so that the charged particle beams have a desired sectional shape and travel towards a desired aperture hole and which returns the charged particle beams passing through said aperture hole to an optical axis thereof;

a reducing projecting optical system which forms a multi-pole lens field so that the charged particle beams passing through said character aperture form an image on the substrate without forming any crossover between said character aperture and the substrate; and a second deflector which deflects the charged particle beams passing through said character aperture by means of an electrostatic field in X directions and the charged particle beams in Y directions independently of each other to scan the substrate with the charged particle beams.

24. A charged particle beam exposure system comprising:

a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;

an illumination optical system which adjusts a beam diameter of the charged particle beams so that density of the charged particle beams is uniform;

a character aperture in which an aperture hole is formed in a shape corresponding to a desired pattern to be written;

a first deflector which deflects the charged particle beams by an electrostatic field so that the charged particle beams have a desired sectional shape and travel towards a desired aperture hole and which returns the charged particle beams passing through said aperture hole to an optical axis thereof;

a reducing projecting optical system which forms a multi-pole lens field so that the charged particle beams passing through said character aperture substantially reduce at the same demagnification both in X and Y directions when the optical axis extends in Z directions and form an image on the substrate without forming any crossover between said character aperture and the substrate; and a second deflector which includes an electrostatic deflector and deflects the charged particle beams passing through said character aperture by superimposing the electrostatic field on said multi-pole lens field to scan the substrate with the charged particle beams.

25. A charged particle beam exposure system comprising:

a charged particle beam emitting device which generates charged particle beams with which a substrate is irradiated, said charged particle beam emitting device generating the charged particle beams at an accelerating voltage which is lower than that at which an influence of a proximity effect occurs, the proximity effect being a phenomenon in which at least one of a secondary charged particle and a reflected charged particle which is produced from the surface of the substrate irradiated with the charged particle beams influences an exposure extent of a pattern which is adjacent to a pattern to be written;

an illumination optical system which adjusts a beam diameter of the charged particle beams so that density of the charged particle beams is uniform;

a character aperture in which an aperture hole is formed in a shape corresponding to a desired pattern to be written;

a first deflector which deflects the charged particle beams by an electrostatic field so that the charged particle beams have a desired sectional shape and travel towards a desired aperture hole and which returns the charged particle beams passing through said aperture hole to an optical axis thereof;

a reducing projecting optical system which includes four multi-pole lenses which form a multi-pole lens field, respectively, so that the charged particle beams passing through said character aperture form an image on the substrate without forming any crossover between said character aperture and the substrate, said multi-pole lenses being controlled to form first through fourth electrostatic fields to sequentially form a divergent electrostatic field, a divergent electrostatic field, a convergent electrostatic field, and a divergent electrostatic field in X directions and to sequentially form a convergent electrostatic field, a convergent electrostatic field, a divergent electrostatic field, and a convergent electrostatic field in Y directions; and a second deflector which includes a first main deflector and a second main deflector and which deflects the charged particle beams passing through said character aperture independently in said X and Y directions to scan the substrate with the charged particle beams by deflecting the charged particle beams in the X directions by a first main deflection field formed by said first main deflector and a second main deflection field formed by said second main deflector and deflecting the charged particle beams in the Y directions by said second main deflection field, said first main deflector being provided between said second multi-pole lens and said third multi-pole lens, and said third multi-pole lens and said fourth multi-pole lens serving as said second main deflector to superimpose an electrostatic deflection field on said multi-pole lens field.

* * * * *